United States Patent
Osborn

(10) Patent No.: US 12,245,404 B2
(45) Date of Patent: Mar. 4, 2025

(54) USING THE CASING OF A COOLING COIL AS THE ONLY CASING OF AN AIR HANDLER OF A DATA CENTER

(71) Applicant: Ascent Inc., Danville, CA (US)

(72) Inventor: Andrew J. Osborn, Danville, CA (US)

(73) Assignee: Ascent Inc., Danville, CA (US)

( * ) Notice: Subject to any disclaimer, the term of this patent is extended or adjusted under 35 U.S.C. 154(b) by 363 days.

(21) Appl. No.: 17/725,517

(22) Filed: Apr. 20, 2022

(65) Prior Publication Data
US 2023/0345678 A1  Oct. 26, 2023

(51) Int. Cl.
*H05K 7/20* (2006.01)

(52) U.S. Cl.
CPC ..... *H05K 7/20745* (2013.01); *H05K 7/20836* (2013.01)

(58) Field of Classification Search
CPC ........................ H05K 7/20745; H05K 7/20836
USPC ........................................................ 454/184
See application file for complete search history.

(56) References Cited

U.S. PATENT DOCUMENTS

| | | | | |
|---|---|---|---|---|
| 7,669,641 B2 * | 3/2010 | Rembold | ............... | F24F 13/222 165/53 |
| 8,061,415 B2 * | 11/2011 | Hancock | ................. | F25B 39/00 165/910 |
| 8,203,841 B2 * | 6/2012 | Chang | ................ | H05K 7/20745 165/104.33 |
| 8,251,785 B2 * | 8/2012 | Schmitt | .............. | H05K 7/20745 705/28 |
| 8,988,879 B2 * | 3/2015 | Hamburgen | ......... | H05K 7/2079 361/679.48 |
| 9,839,163 B2 * | 12/2017 | Keisling | ............ | H05K 7/20781 |
| 11,240,936 B2 * | 2/2022 | Chehade | .................. | H05K 7/18 |
| 2011/0299242 A1 * | 12/2011 | Grantham | .......... | H05K 7/20745 361/688 |
| 2012/0012278 A1 * | 1/2012 | Noteboom | ......... | H05K 7/20745 165/185 |

* cited by examiner

*Primary Examiner* — Avinash A Savani
*Assistant Examiner* — Dana K Tighe
(74) *Attorney, Agent, or Firm* — Imperium Patent Works; Darien K. Wallace

(57) ABSTRACT

An air handler for cooling a data center has an outer side formed by a tube support sheet. The tube support sheet has a plurality of holes. A plurality of tubes of a cooling coil are aligned with the plurality of holes and are orthogonal to the tube support sheet. The air handler has a fan plate with a fan hole. A fan motor is mounted to the fan plate adjacent to the fan hole. The tube support sheet is attached to a top sheet and the fan plate and is perpendicular to both the top sheet and the fan plate. The plurality of tubes pass through a plurality of fin sheets that are oriented parallel to the tube support sheet. The fan motor powers a fan that is adapted to draw air from the hot aisle of the data center over the plurality of tubes of the cooling coil.

20 Claims, 8 Drawing Sheets

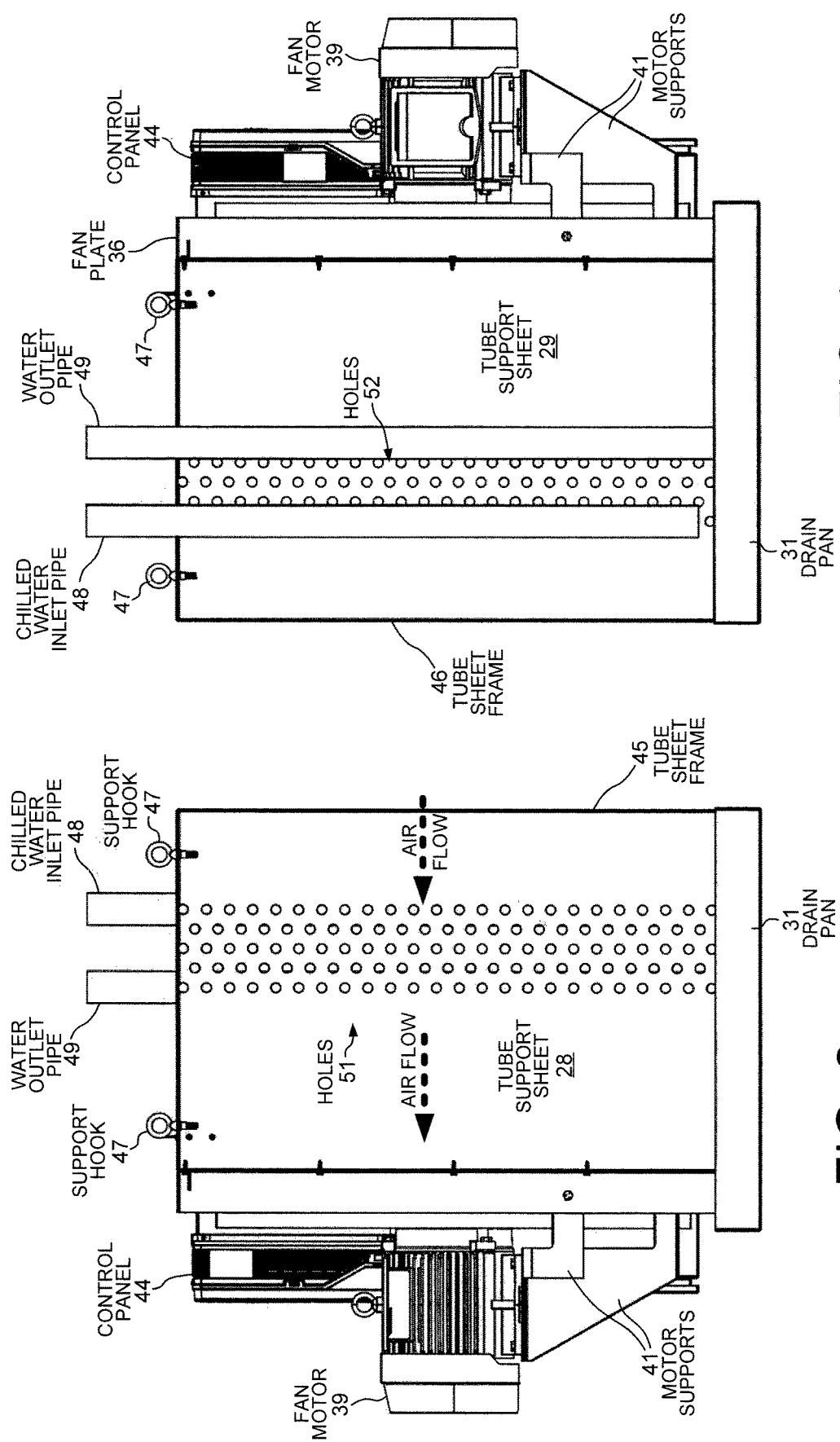

USING THE CASING OF A COOLING COIL AS THE ONLY CASING OF AN AIR HANDLER OF A DATA CENTER

TECHNICAL FIELD

The described embodiments relate generally to an air handler for cooling a data center and, more particularly, to an air handler whose coil casing functions as the single casing of the air handler.

BACKGROUND

The increasing use of data-driven services, video applications and cloud computing has resulted in an increased demand for data centers. Building and upgrading the data centers is costly, and a significant portion of the expense is related to cooling the data centers. There is naturally an effort to reduce the capital cost of the cooling systems for the data centers. Most cooling systems function by recirculating and cooling the air in the data center. The components of the cooling systems that direct and cool the air are primarily made of metal, which is expensive. A novel design of a cooling unit of a data center is sought that comprises less metal than conventional cooling units and thereby is less expensive to manufacture.

SUMMARY

A novel air handler for cooling a data center has an outer side formed by a tube support sheet. The tube support sheet has a plurality of holes. A plurality of tubes of a cooling coil are aligned with the plurality of holes and are oriented orthogonally to the tube support sheet. The air handler has a fan plate with a fan hole. The fan plate forms part of a fan wall. A fan motor is mounted to the fan plate adjacent to the fan hole. The fan plate is attached to a top sheet of the air handler. The tube support sheet is attached to the fan wall and the top sheet and is perpendicular to both the fan wall and the top sheet. The plurality of tubes pass through a plurality of fin sheets that are oriented parallel to the tube support sheet. The fan motor powers a fan blade that is adapted to draw air from the hot aisle of the data center over the plurality of tubes of the cooling coil.

In another embodiment, a cooling unit for cooling heated air includes a tube support sheet that forms an outer side of the cooling unit. The tube support sheet has rows of holes. Tube segments are arranged parallel to one another and are aligned with the holes in the tube support sheet. A U-bend is disposed on an opposite side of the tube support sheet from the tube segments. The U-bend connects a first of the tube segments to a second of the tube segments. A plurality of fin sheets are oriented parallel to the tube support sheet. The tube segments pass through the fin sheets. A top sheet is oriented perpendicular to the tube support sheet. An edge of the top sheet abuts a first edge of the tube support sheet. A second edge of the tube support sheet abuts a drain pan that is oriented parallel to the top sheet. A fan wall is oriented perpendicular to the tube support sheet. The fan wall is also oriented perpendicular to the top sheet. An edge of the fan wall abuts a second edge of the tube support sheet. A fan motor is attached to the fan wall. A fan is powered by the fan motor and is adapted to draw the heated air over the tube segments. A variable frequency drive controller is attached to the fan wall and is adapted to control the fan motor.

In another embodiment, a method of making an air handler for cooling a data center involves using a tube support sheet as an outer side of the casing of the air handler. A fan plate with a fan hole is attached to a top sheet, which is attached to a tube support sheet. The tube support sheet has a plurality of holes. A plurality of tubes are aligned with the plurality of holes. Each of the tubes is oriented orthogonally to the tube support sheet, and the tubes are parallel to the fan plate. Each of the tubes is connected to another of the tubes by a U-bend pipe that is disposed on an opposite side of the tube support sheet from the tubes. A fan motor is mounted to the fan plate adjacent to the fan hole. The top sheet is attached to the tube support sheet such that an edge of the tube support sheet abuts an edge of the top sheet. A drain pan is connected to the tube support sheet and is oriented perpendicular to both the tube support sheet and the fan plate.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 8 is a right side view of the air handler of FIG. 4.

FIG. 9 is a left side view of the air handler of FIG. 4 showing the larger pipes.

DETAILED DESCRIPTION

Reference will now be made in detail to some embodiments of the invention, examples of which are illustrated in the accompanying drawings.

Figure 1:
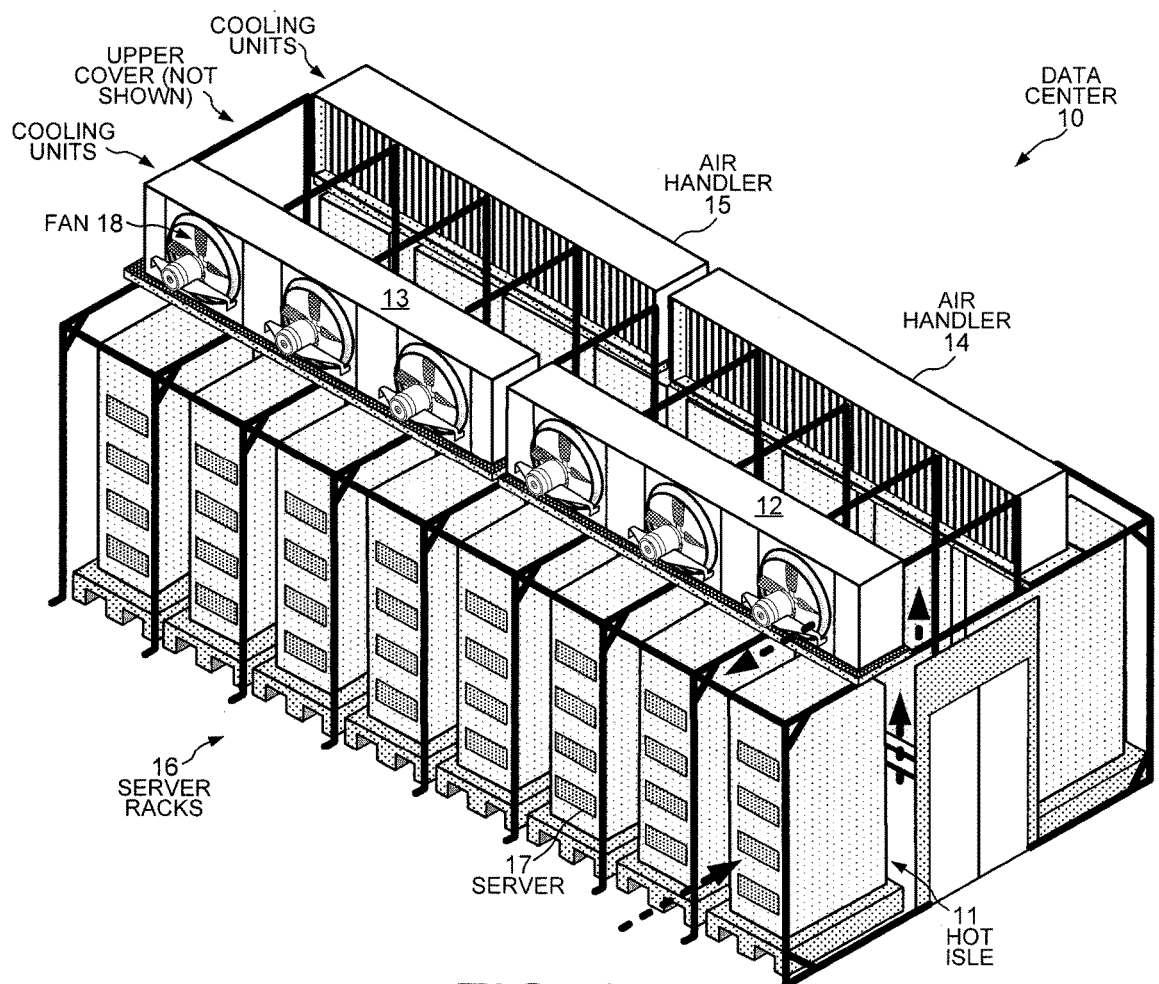
FIG. 1 is a perspective view of a data center that is cooled by novel air handlers.

FIG. 1 shows a perspective view of a data center 10 arranged with a hot aisle 11 and an air handler 12 (also called a cooling unit) according to one embodiment. The data center 10 includes a number of server racks 16. Each server rack 16 contains one or more servers 17 arranged in a stack. For example, the servers 17 can be used to provide data and computing services to customers of the data center 10. Alternatively, the server racks 16 can contain storage devices to provide cloud storage services, for example. The servers, storage devices and other electronic components of the data center 10 generate heat during operation. The cooling units 12-15 are used to remove the heat generated by the servers, storage devices and other electronic components.

The server racks 16 of data center 10 are arranged in two rows on either side of the hot aisle 11. The back ends of the servers 17 face the hot aisle 11. Each server rack 16 has one or more fans that blow air from the front of the rack, around the servers 17, and out the back of the server rack 16 and into the hot aisle 11. In one configuration, the fans are located towards the back of the server racks 16 and pull cooler air from the data center room over the servers 17 and expel the air that has been heated by the servers into the hot aisle 11. In one operational example, the temperature of the air in the room of the data center 10 is maintained at about 75° F., and the temperature of the air in the hot aisle 11 reaches about 95° F.

In this embodiment, the hot aisle 11 is closed at either end by doors and on top by an upper cover in order to achieve hot aisle containment. This prevents the heated air from escaping the hot aisle 11 at the level of the server racks 16 or out the top. An operator of the data center 10 can enter the hot aisle 11 through the doors to access the back ends of the server racks 16, for example, to perform maintenance services. The air handlers 12-15 (also called cooling units) are arranged above the server racks 16. In the embodiment shown in FIG. 1, each air handler has three fans 18. In other embodiments, the air handlers have a different number of fans or only a single fan. In the implementation of data center 10 shown in FIG. 1, the air handlers 12-25 and the aisle doors are supported by a framework of heavy metal bars. There is a channel between air handlers 12-13 and air handlers 14-15, which is narrower than the width of the hot aisle 11. This narrower air channel is covered by the upper cover of plastic, plywood or metal. The fans 18 of the air handlers 12-15 draw the heated air up and out of the hot aisle 11 and blow cooled air back into the room of the data center 10. Thus, there is no bypass airflow, and all air in the hot aisle 11 is contained until it exits the containment area through the air handlers 12-15. The flow of the air is shown by dashed arrows in FIG. 1. In other implementations of the data center 10, there is no cover over the narrower channel between the air handlers 12-15, and the channel is open towards the ceiling of the room of the data center 10.

Figure 2:
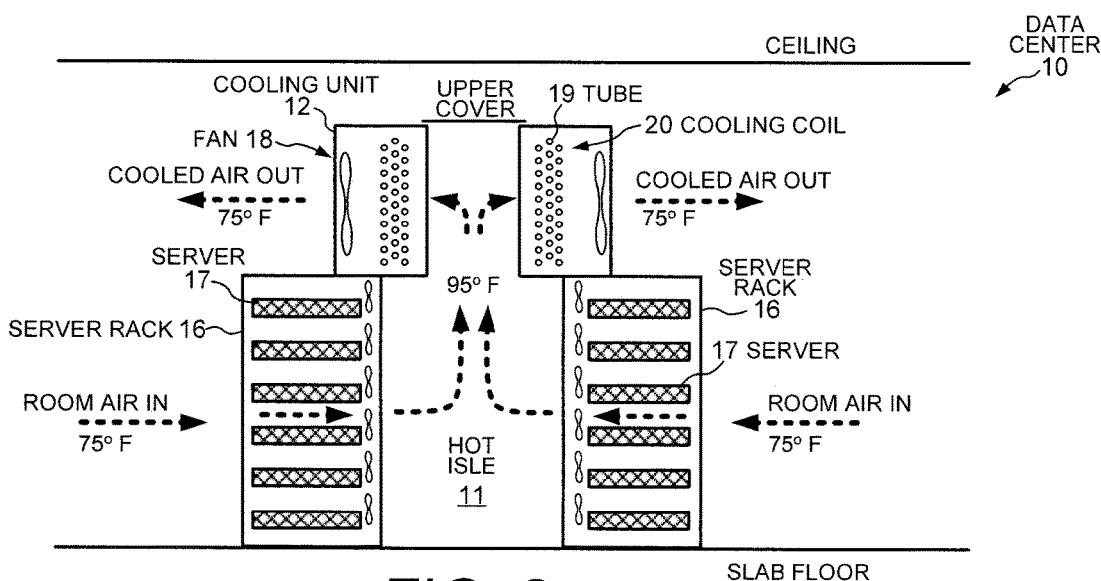
FIG. 2 is a schematic side view of the data center of FIG. 1 showing the flow of air into and out of the hot aisle.

FIG. 2 is a schematic side view of the data center 10 showing the flow of air into and out of the hot aisle 11. Air at the temperature of the room (about 75° F.) is pulled across the servers 17 by fans at the back of the server racks 16 and is heated by the electronic components on the servers, thereby cooling those components. The heated air is expelled into the hot aisle 11, where the temperature reaches about 95° F., in one implementation. The fans 18 in the air handlers 12-15 draw the heated air up out of the hot aisle 11, through the air handlers 12-15, and out into the room of the data center 10. FIGS. 1-2 show an embodiment of air handlers 12-15 that have outboard motors of fans 18 that pull air through the cooling coils 20. In another embodiment, the air handlers have inboard motors with fans that push air through the cooling coils 20. In both embodiments, the fans 18 move the heated air up from the hot aisle 11 and out through the air handlers 12-15.

Each air handler 12 has a plurality of parallel, horizontal tubes 19 of a cooling coil 20. Adjacent horizontal tubes 19 are connected at the ends by U-bend pipes 21 to form a continuous conduit of the cooling coil 20. In one implementation, chilled water is fed through the cooling coil 20. In another implementation, a refrigerant is present in the cooling coil 20 and is cooled using a pressurized refrigeration cycle. In both implementations, the cooling coil 20 operates as an air-to-liquid heat exchanger. As the heated air from the hot aisle 11 is drawn or blown between the tubes 19 of the cooling coil 20, the air is cooled. Cooled air at about 75° F. is thereby returned to the room of the data center 10.

Conventional cooling units used to cool data centers include large amounts of metal. Nearly all of the components of the cooling units are made of metal, which is expensive. The cooling coil of a conventional cooling unit is encased in a coil casing, which is then secured inside the casing of the cooling unit.

Figure 3:
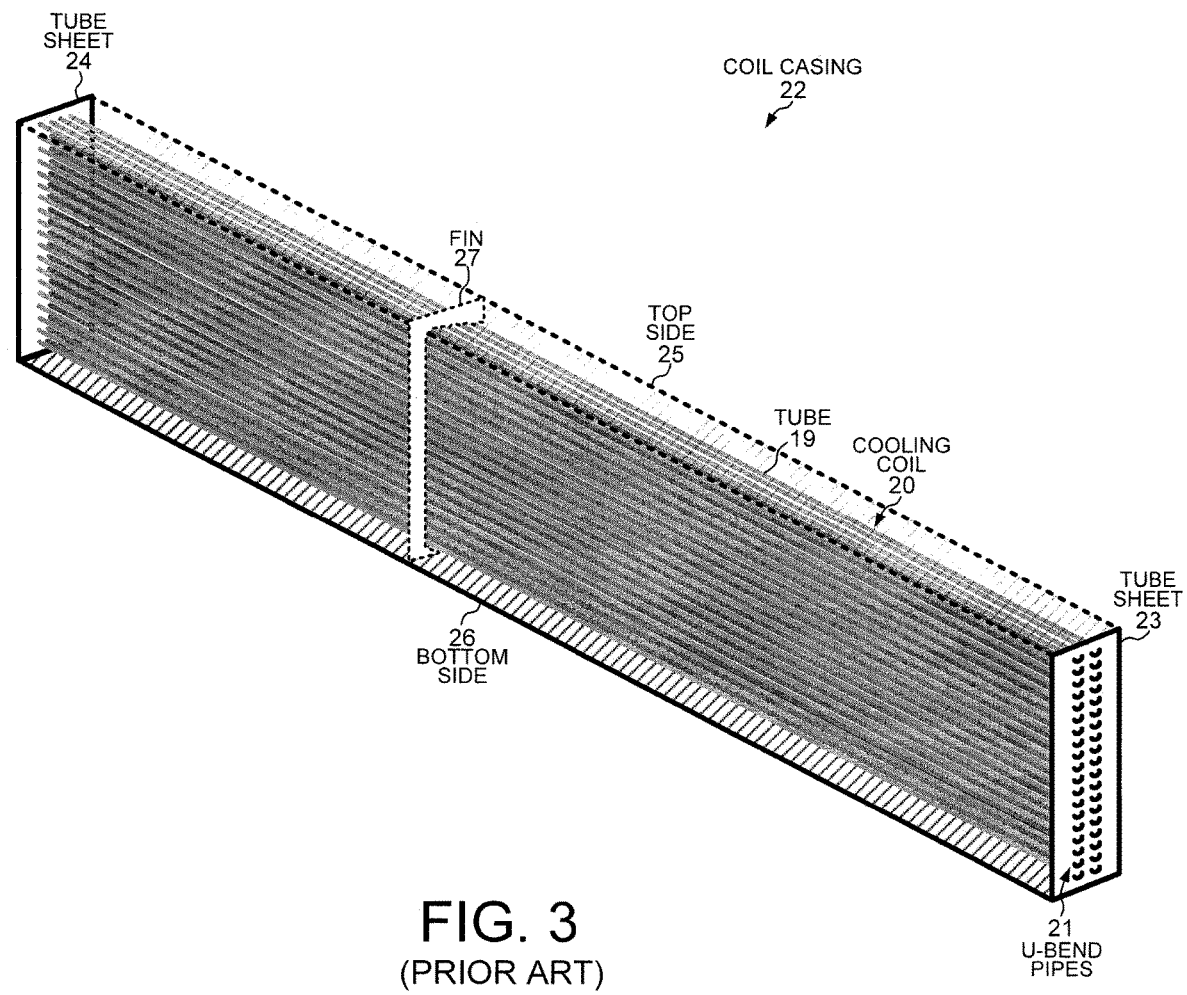
FIG. 3 (prior art) shows an exemplary structure of a coil casing of a conventional cooling unit.

FIG. 3 (prior art) shows an exemplary structure of a coil casing 22 used in a conventional cooling unit. The parallel tubes 19 of the cooling coil 20 are supported on opposite sides by tube support sheets 23-24. Holes are present in the tube support sheets 23-24 through which the ends of the tubes 19 protrude. U-bend pipes 21 connect the ends of pairs of adjacent tubes 19 to form a continuous conduit of the cooling coil 20 through which chilled water or a cold refrigerant it pumped. The coil casing 22 also has a top side 25 and a bottom side 26 that connect the opposite tube support sheets 23-24. Typically, the tube support sheets 23-24, the top side 25 and the bottom side 26 are all sheets of metal that are attached to each other at the corners to form a rectangular frame. The coil casing also includes a plurality of planar fins 27 oriented parallel to the tube support sheets 23-24. Only one exemplary fin 27 is shown in FIG. 3. The fins 27 are usually thinner than the tube support sheets 23-24. The tubes 19 pass through holes in the fins 27 in a manner similar to how the tubes pass through holes in the tube support sheets 23-24. The fins 27 increase the surface area over which the heated air from the hot aisle flows and allows more heat to be transferred from the heated air to the chilled water or refrigerant in the cooling coil 20. The entire coil casing 22 is placed inside a conventional cooling unit, which has end walls and top and bottom sides that encase the tube support sheets and top and bottom sides of the coil casing.

Figure 4:
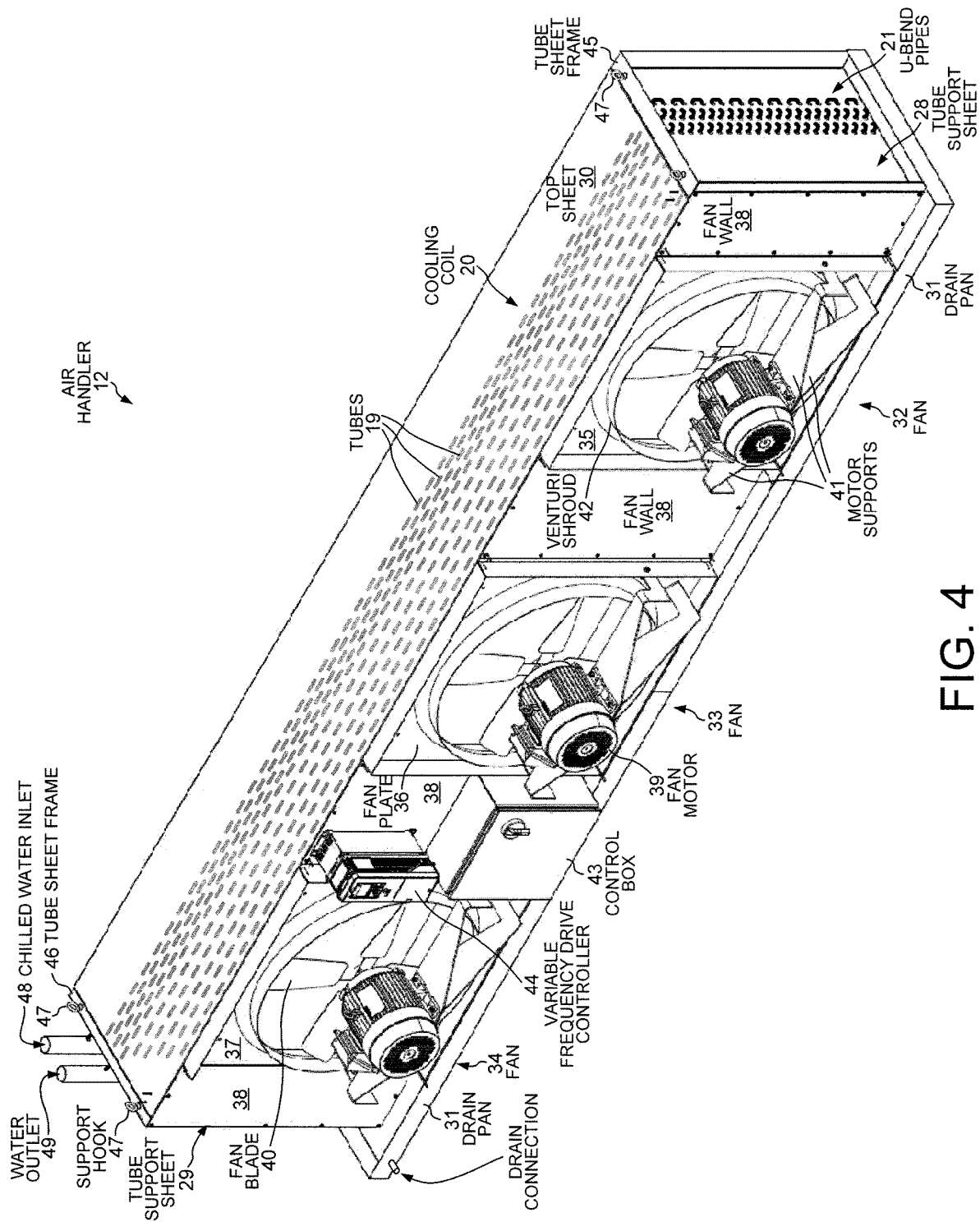
FIG. 4 is a more detailed perspective view of an air handler shown in FIG. 1.

FIG. 4 is a more detailed perspective view of the novel air handler 12 shown in FIG. 1. The cooling coil 20 of air handler 12 is not encased in a separate coil casing, as is the conventional practice. Instead, the tube support sheets 23-24 of the conventional coil casing 22 have been extended to form tube support sheets 28-29, which are the end walls of the air handler 12. The top side 25 of the conventional coil casing 22 has been expanded to form the top sheet 30 of the air handler 12, and the bottom side 26 has been expanded to form a bottom sheet of the air handler 12. The top and bottom edges of the tube support sheets 28-29 abut the edges of the top sheet 30 and bottom sheet, respectively. Thus, the novel air handler 12 has a single casing as opposed to a separate coil casing enclosed by an outer casing of a conventional cooling unit. In addition, a drain pan 31 is attached to the extended tube support sheets 28-29 below the bottom sheet. Holes are formed in the bottom sheet below the cooling coil 20 to allow water that condenses on the tubes 19 to flow into the drain pan 31. The drain pan 31 includes a drain connection to allow the condensed water to be discharged to a drain in the room of the data center 10.

In the embodiment of FIG. 4, air handler 12 has three fans 32-34. The air handler 12 is about fifteen feet long, five feet wide, and seven feet tall. Thus, the air handler has three five-foot sections that each include a fan. Each of the fans 32-34 is mounted on a fan plate 35-37. The three fan plates 35-37 are dispersed between four other sections of a fan wall 38, which is oriented perpendicular to the tube support sheets 28-29. The fan wall 38 is attached to the top sheet 30 and to the tube support sheets 28-29, for example, by welding, riveting or soldering. The bottom edges of the fan wall 38 and support sheets 28-29 are connected to the drain pan 31. Water condenses on the cooling coil 20 and drips into the drain pan 31 through a series of holes in the bottom sheet if the air in the room of the data center 10 is humid and the fluid flowing through the cooling coil 20 is sufficiently cold.

Each of the fans 32-34 has a fan motor 39 that turns fan blades 40. Each motor 39 is mounted onto the fan plate 35-37 by motor supports 41. Each fan plate 35-37 includes a venturi shroud 42 around a fan hole in which the fan blades 40 spin. A control box 43 and a variable frequency drive controller 44 are attached to the fan wall 38 and provide a user interface for the operator of the data center 10 to monitor and control the operation of the air handler 12. The fans 32-34, the control box 43 and the variable frequency drive controller 44 are electrically connected to each other and to electrical current of the data center 10 by wires, which are not illustrated in FIG. 4. The variable frequency drive controller 44 can be used to modulate the electrical consumption of the fans 32-34 and to control the speed at which the fan motors 39 and connected fan blades 40 rotate. In addition, the flow and temperature of the fluid in the cooling coil 20 can be monitored. The control box 43 can also include circuit breakers for the fans 32-34. Thus, there is a single point control panel attached to a wall 38 that is mounted on the same horizontal support 31 as are the tube support sheets 28-29.

FIG. 4 also shows a tube sheet frame 45 that reinforces tube support sheet 28. And tube sheet frame 46 is formed around tube support sheet 29. The entire weight of the air handler 12 is supported by the tube support sheets 28-29, such as the weight of the copper tubes 19, the many aluminum fins 27, and the electric fan motors 39. Thus, the tube sheet frames 45-46 provide stability to the casing of the air handler 12. The air handler 12 can be lifted into position above the server racks 16 by using support hooks 47 (also called lifting eyes) that are attached to the tube sheet frames 45-46. Thus, the air handler 12 is adapted to be lifted only via the support hooks 47. FIG. 4 shows the U-bend pipes 21 that protrude outside the air handler 12 from the tube support sheet 28. The U-bend pipes 21 connect adjacent tube segments 19 disposed between the tube support sheets 28-29. FIG. 4 also shows the larger distribution pipes 48-49 on the outside of tube support sheet 29 through which chilled water or refrigerant is supplied and returned from the cooling coil 20.

Figure 5:
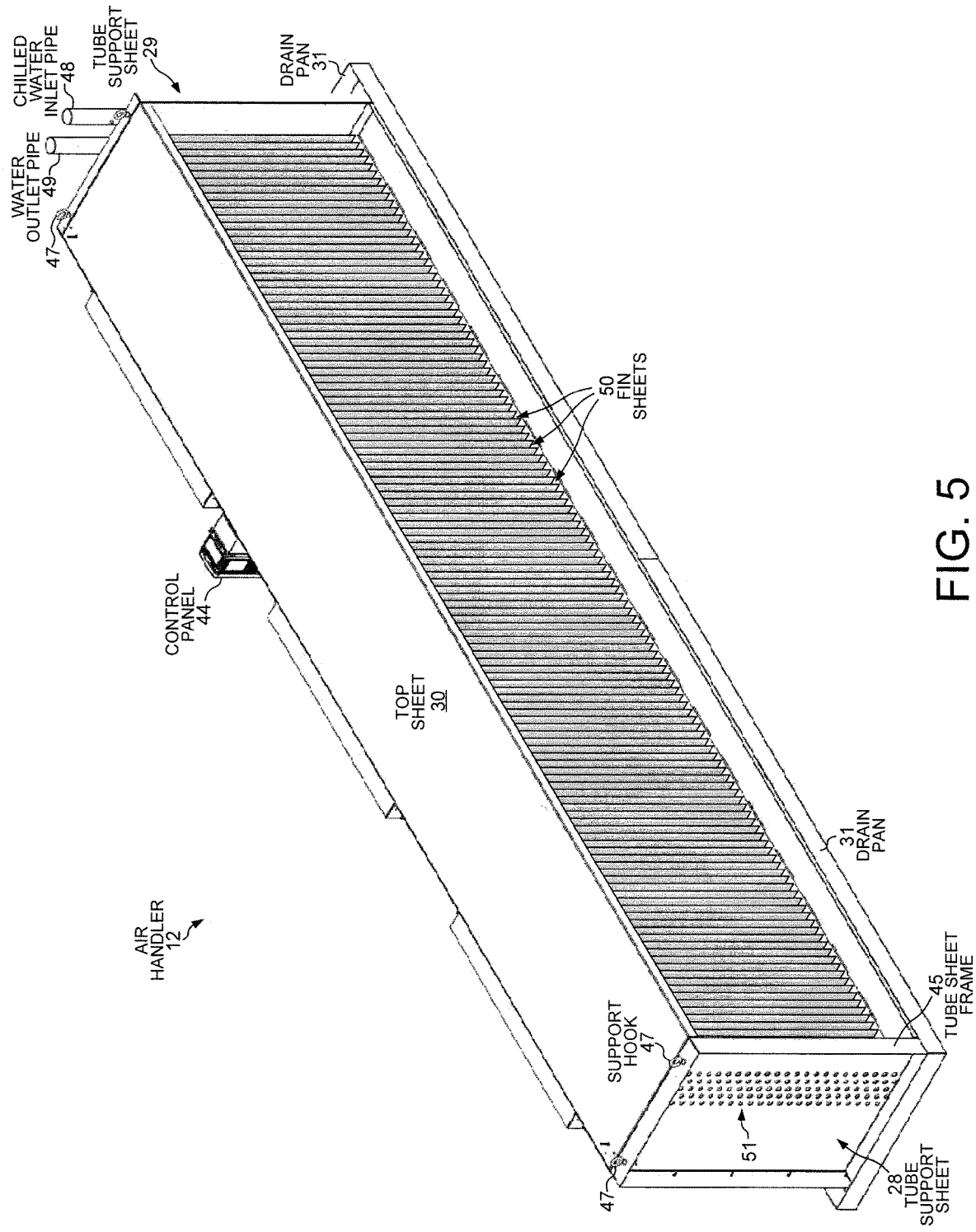
FIG. 5 is a perspective view showing the back of the air handler shown in FIG. 4.

FIG. 5 is a perspective view showing the back of the air handler 12 opposite the fan wall 38. The back of the air handler 12 is open and has no sheet metal siding or additional cooling unit casing. Heated air from the hot aisle 11 can freely enter the air handler 12 from the back as the air is drawn in by the fans 32-34 and moved through the air handler 12. FIG. 5 shows that many planar, vertical fin sheets 50 are oriented parallel to the tube support sheets 28-29. Tube segments 19 pass through holes in the fin sheets 50, but are not visible in FIG. 5. FIG. 5 also shows the chilled water inlet pipe 48 and the water outlet pipe 49. These larger pipes 48-49 are closed off near the drain pan 31 and extend upwards towards the ceiling of data center 10, where they connect to the building distribution pipes that supply chilled water and return warmer water. The larger pipes 48-49 connect to the smaller tube segments 19 of the cooling coil 20 at multiple locations. The tube segments 19, U-bend pipes 21 and pipes 48-49 are not connected such that a single fluid conduit is formed through which chilled water must flow before it is returned to the water outlet pipe 49. Instead, multiple shorter fluid paths through the cooling coil 20 are formed from the inlet pipe 48 to the outlet pipe 49. This maintains a lower temperature of the water flowing through the cooling coil 20 than would a single fluid path because water that has already absorbed significant heat from the heated air passing over the tube segments 19 is not made to flow even farther through the tubes. This also enables a more efficient heat transfer between the heated air from the hot aisle 11 and the water in the cooling coil 20 because the rate of heat transfer is proportional to the difference in temperature between the heated air and the water in the tubes 19. The heat transfer is also enhanced by the many planar fin sheets 27 through which the tube segments 19 pass. Heat absorbed by the fin sheets 27 is transferred to the tubes 19 and then to the water flowing through the tubes 19. In the view of FIG. 5, the U-bend pipes 21 protruding from the tube support sheet 28 are not shown. Instead, holes 51 are shown in the tube support sheet 28 through which the ends of the tube segments 19 or the U-bend pipes 21 would pass. The pattern of holes in the fin sheets 27 corresponds to the holes 51 shown in the tube support sheet 28.

Figure 6:
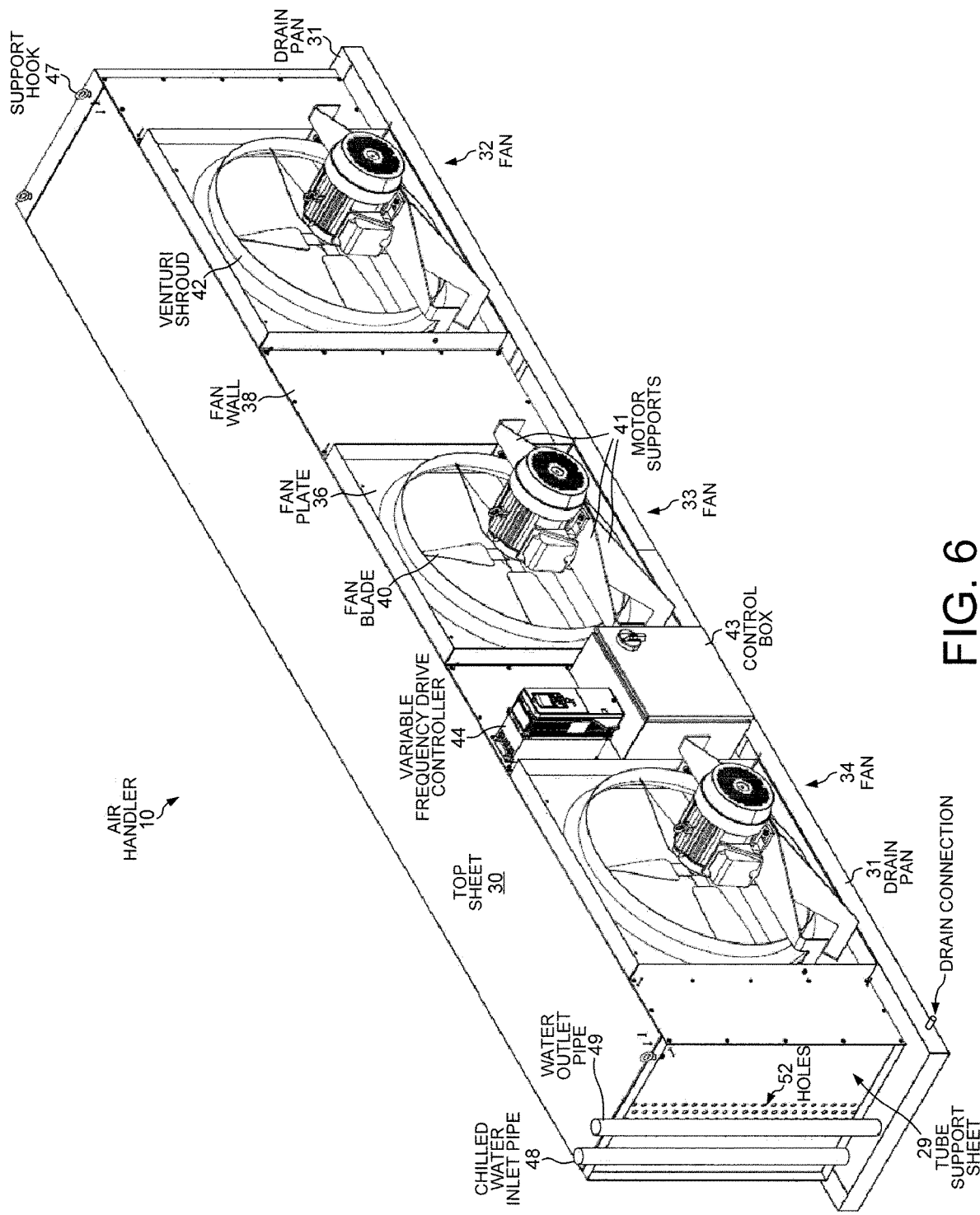
FIG. 6 is a perspective view of the air handler of FIG. 4 showing the end at which larger pipes are attached outside the air handler.

FIG. 6 is a perspective view of the air handler 12 from the end at which the larger pipes 48-49 are attached outside of the tube support sheet 29. The chilled water inlet pipe 48 and the water outlet pipe 49 are closed off at their ends near the drain pan 31 and extend upwards to connect with building distribution pipes near the ceiling of the data center 10. The inlet pipe 48 and the outlet pipe 49 connect to some of the smaller tubes 19, but the associated short connecting tubes are not shown in FIG. 6. The ends of the tube segments 19 that are not connected to the pipes 48-49 are connected to one another via U-bend pipes 21, which are not shown in the view of FIG. 6. Instead, FIG. 6 simply shows the holes 52 in tube support sheet 29 where the short connecting tubes or the U-bend pipes 21 would be attached.

Figure 7:
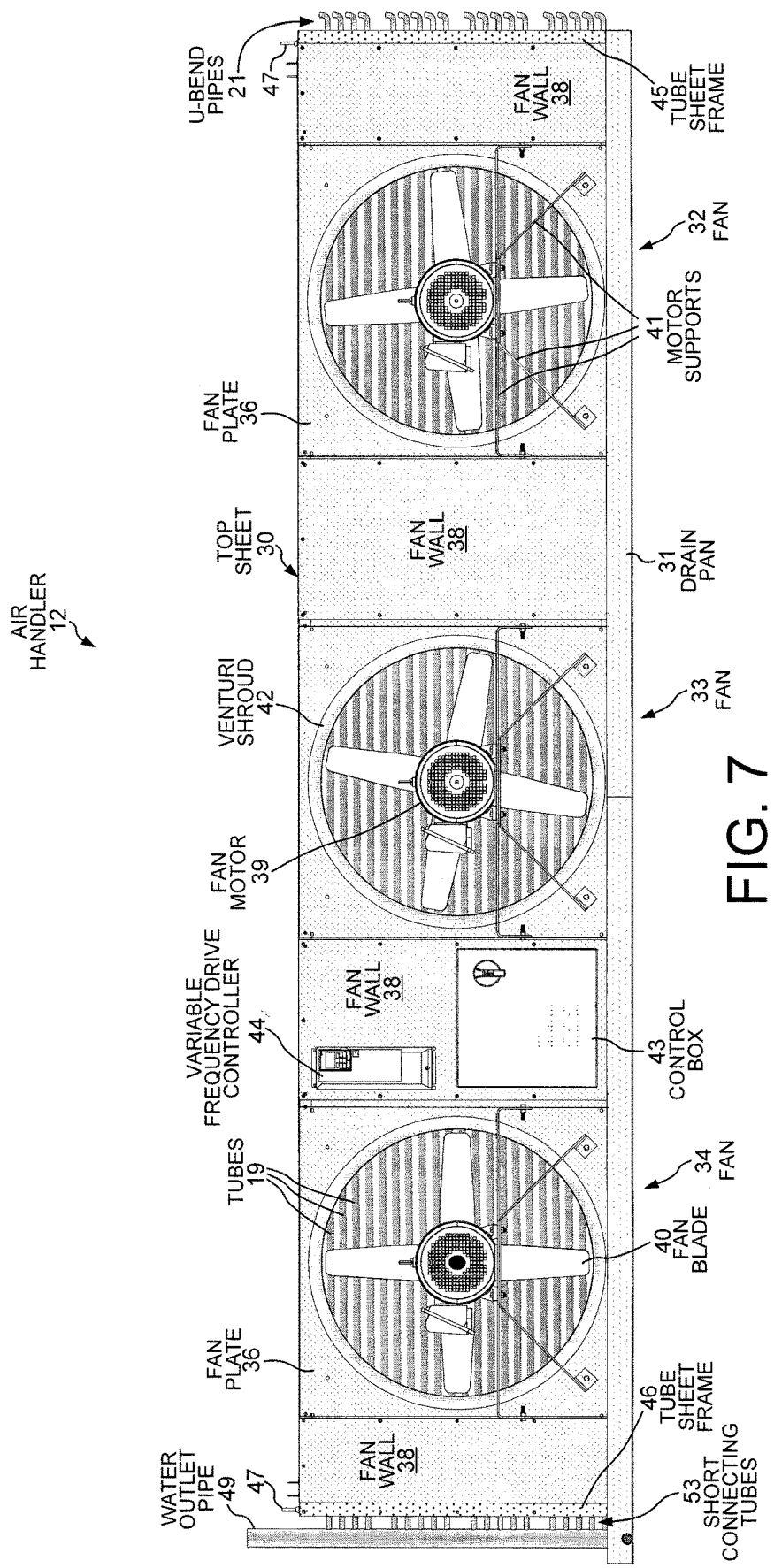
FIG. 7 is a front view of the air handler of FIG. 4 showing U-bend pipes protruding from one side and short connecting tubes on the other side between the air handler and the larger pipes.

FIG. 7 is a front view of the air handler 12 showing the three fans 32-34 disposed in three fan holes in the fan wall 38. The parallel tube segments 19 that extend between the tube support sheets 28-29 are apparent through the fan holes. Only one layer of tube segments 19 of the cooling coil 20 is illustrated. FIG. 7 shows U-bend pipes 21 protruding from tube support sheet 28 on the right side and short connecting tubes 53 between the tube support sheet 29 and the water outlet pipe 49 on the left side. For clarity, the U-bend pipes 21 that connect tube segments 19 on the left side are not shown. The short connecting tubes 53 between the tube support sheet 29 and the chilled water inlet pipe 48 are also not illustrated for clarity purposes.

FIG. 8 is a right side view of the air handler 12 showing the tube support sheet 28. FIG. 8 does not show the U-bend pipes 21 that connect adjacent tubes 19. Instead, holes 51 are shown in the tube support sheet 28 at the positions of the tubes 19. In one embodiment, the tubes 19 extend through the holes 51, and then the ends of adjacent tubes are connected by the U-bend pipes 21. In another embodiment, the ends of the U-bend pipes 21 pass through the holes 51 and are connected to the tubes 19 on the inside of the tube support sheet 28. Each of the fin sheets 27, which are oriented parallel to the tube support sheet 28, has the same pattern of holes through which the tubes 19 pass.

FIG. 9 is a left side view of the air handler 12 showing the tube support sheet 29 and the larger pipes 48-49. Holes 52 are shown in the tube support sheet 29 instead of the U-bend pipes 21 that connect adjacent tubes 19. The short connecting tubes 53, which connect the larger pipes 48-49 to the smaller tubes 19 are not visible behind the pipes 48-49. The short connecting tubes 53 connect the pipes 48-49 only to tubes 19 in the outer rows of the exemplary five rows of the tubes 19, which are illustrated in FIGS. 8-9.

Figure 10:
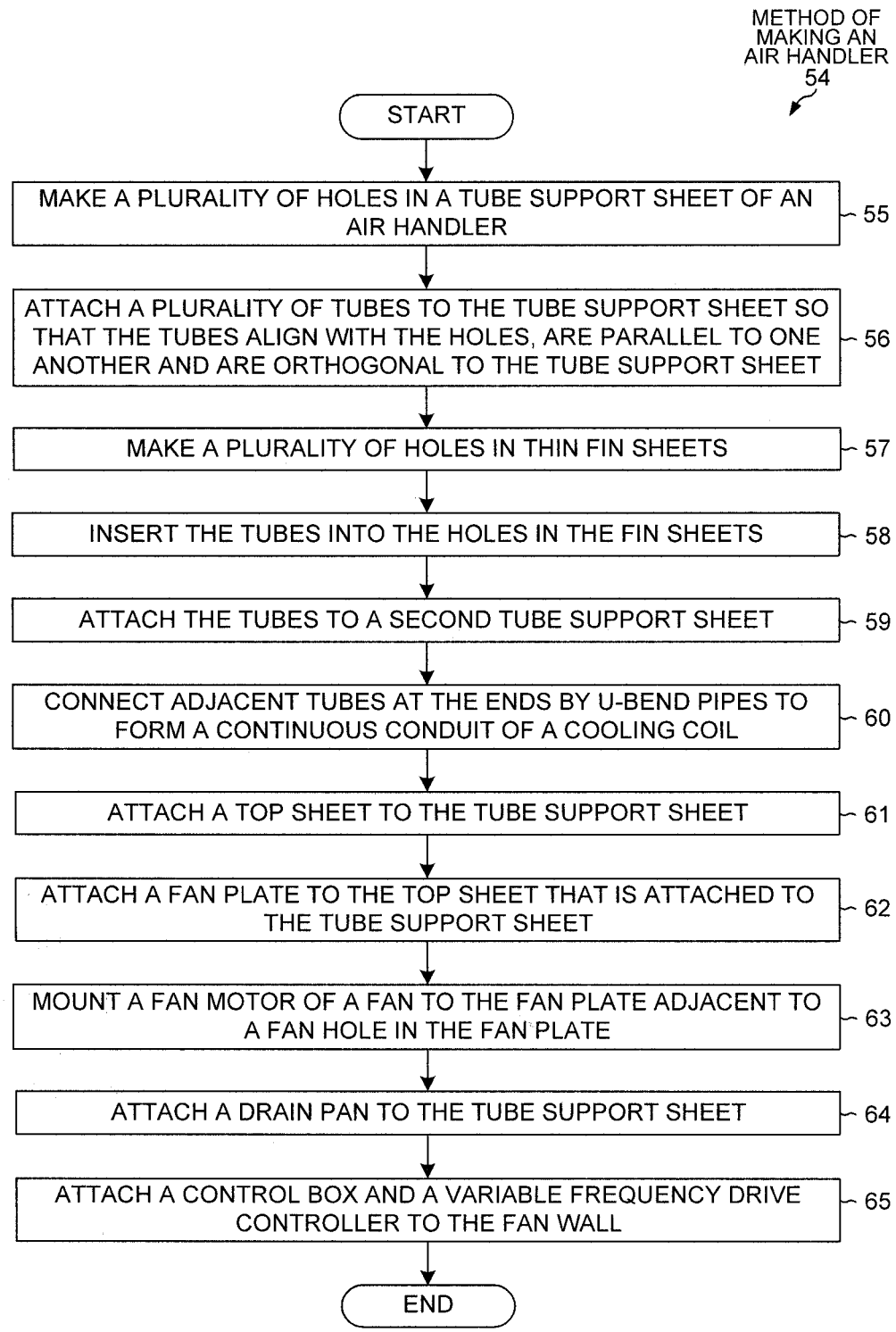
FIG. 10 is a flowchart of steps for making the air handler of FIG. 4.

FIG. 10 is a flowchart of steps 55-65 of a method 54 of making the air handler 12 for cooling data center 10. In a first step 55, a plurality of holes 51 are made in the tube support sheet 28 of the air handler 12. For example, in the embodiment shown in FIG. 8, five rows of holes are drilled in the sheet metal of tube support sheet 28. Holes 52 are also made in the opposite tube support sheet 29.

In step 56, a plurality of tubes 19 of a cooling coil 20 are attached to the tube support sheet 28 such that the plurality of tubes 19 are aligned with the plurality of holes 51 and such that the tubes are parallel to one another and orthogonal to the tube support sheet.

In step 57, a plurality of holes are made in thin, aluminum fin sheets 50. The pattern of holes in the fin sheets 50 corresponds to the holes 51 in the tube support sheet 28. In step 58, the tubes 19 are inserted into the holes in the fin sheets 50 such that the fin sheets are oriented parallel to the tube support sheet 28 with only a small spacing between the fin sheets 50. For example, eleven fins per inch can be slid onto the tubes 19. In step 59, the tubes 19 of the cooling coil 20 are attached to the second tube support sheet 29 and are aligned with the holes 52 in the tube support sheet 29.

In step 60, adjacent tubes 19 are connected at the ends by U-bend pipes 21 to form a continuous conduit of the cooling coil 20. The tubes 19 abut the tube support sheet 28 from one side, and the U-bend pipes 21 abut the tube support sheet from the opposite side. By connecting the tubes 19 with U-bend pipes 21, several longer paths for the cooling fluid are created that originate at a chilled water inlet pipe 48, pass through the second tube support sheet 29, extend to a U-bend pipe 21 on the outside of tube support sheet 28, return to a U-bend pipe on the outside of the second tube support sheet 29, and then travel back and forth a few times between tube support sheet 28 and tube support sheets 29 before passing through a short connecting tube 53 and terminating at a water outlet pipe 49.

In step 61, a top sheet 30 is attached to the tube support sheet 28 such that an edge of the tube support sheet 28 abuts an edge of the top sheet 30. In step 62, a fan plate 36 is attached to the top sheet 30, which is attached to the tube support sheet 28. The fan plate 36 has a fan hole and a venturi shroud 42 surrounding the fan hole. The fan plate 36 forms part of the fan wall 38 that extends between the tube support sheets 28-29. In the embodiment shown in FIG. 4, there are three fan plates 36 along the fan wall 38. In step 63, a fan motor 39 of a fan 32 is mounted to the fan plate 36 adjacent to the fan hole. In the embodiment shown in FIG. 4, three fans 32-34 are mounted along the fan wall 38.

In step 64, a drain pan 31 is attached to the tube support sheet 28 so that the drain pan is oriented perpendicular to both the tube support sheet 28 and the fan plates 36. The drain pan 31 is also attached to the second tube support sheet 29.

And in step 65, a control box 43 and a variable frequency drive controller 44 are attached to the fan wall 38. Each fan plate 36 is reinforced by a frame of stiffeners. The fan plates 36 are attached to the top sheet 30 and bottom sheet in part via the vertical stiffeners of the fan plate frames. A tube sheet frame 45 is formed around tube support sheet 28, and support hooks 47 are connected to the tube sheet frame 45. On the opposite side of the air handler 12, a tube sheet frame 46 is formed around tube support sheet 29, and support hooks 47 are connected to the tube sheet frame 46. The air handler 12 can then be lifted and moved into place above the server racks 16 of the data center 10 by connecting cables to the support hooks 47.

Although certain specific exemplary embodiments are described above in order to illustrate the invention, the invention is not limited to the specific embodiments. Accordingly, various modifications, adaptations, and combinations of various features of the described embodiments can be practiced without departing from the scope of the invention as set forth in the claims.

What is claimed is:

1. An air handler for cooling a data center, comprising:
   a fan plate with a fan hole, wherein the fan plate forms part of a fan wall, and wherein the fan wall extends in a plane;
   a fan motor mounted to the fan plate adjacent to the fan hole;
   a plurality of tubes of a cooling coil, wherein the plurality of tubes are parallel to one another; and
   a tube support sheet having a plurality of holes, wherein the plurality of tubes are aligned with the plurality of holes, wherein each tube of the plurality of tubes is oriented orthogonally to the tube support sheet, wherein the tube support sheet forms an outer side of the air handler, and wherein the tube support sheet extends to the fan wall.

2. The air handler of claim 1, wherein each tube of the plurality of tubes is connected to another of the plurality of tubes by a U-bend pipe, and wherein the U-bend pipe protrudes outside the air handler.

3. The air handler of claim 1, wherein the air handler has no wall oriented parallel to the tube support sheet and disposed on an opposite side of the tube support sheet from the plurality of tubes.

4. The air handler of claim 1, further comprising:
   a drain pan, wherein the tube support sheet extends to the drain pan, and wherein the fan wall extends to the drain pan.

5. The air handler of claim 1, further comprising:
   a top sheet, wherein the tube support sheet extends to the top sheet, and wherein the fan wall extends to the top sheet.

6. The air handler of claim 1, further comprising:
   a plurality of fin sheets, wherein the plurality of tubes pass through the plurality of fin sheets.

7. The air handler of claim 1, wherein the fan motor powers a fan, and wherein the fan is adapted to draw air over the plurality of tubes of the cooling coil.

8. An air handler for cooling a data center, comprising:
   a fan plate with a fan hole, wherein the fan plate forms part of a fan wall;
   a fan motor mounted to the fan plate adjacent to the fan hole;
   a plurality of tubes of a cooling coil, wherein the tubes are parallel to one another;
   a tube support sheet having a plurality of holes, wherein the plurality of tubes are aligned with the plurality of holes, wherein each of the tubes is oriented orthogonally to the tube support sheet, wherein the tube support sheet forms an outer side of the air handler, and wherein the tube support sheet extends to the fan wall;
   a second tube support sheet, wherein the plurality of tubes are disposed between the tube support sheet and the second tube support sheet; and
   support hooks attached to the tube support sheet and the second tube support sheet, wherein the air handler is adapted to be lifted only via the support hooks.

9. The air handler of claim 1, wherein the air handler is adapted to cool air from a hot aisle of the data center.

10. A cooling unit for cooling heated air:
a tube support sheet with rows of holes;
a plurality of tube segments, wherein the plurality of tube segments are arranged parallel to one another, and wherein the plurality of tube segments are aligned with the holes;
a top sheet oriented perpendicular to the tube support sheet, wherein an edge of the top sheet abuts a first edge of the tube support sheet; and
a fan wall oriented perpendicular to the tube support sheet, wherein the fan wall extends in a plane, wherein the fan wall is oriented perpendicular to the top sheet, wherein an edge of the fan wall abuts a second edge of the tube support sheet, and wherein a fan motor is attached to the fan wall.

11. The cooling unit of claim 10, wherein the fan motor is attached to the fan wall by motor supports and a fan plate, wherein the motor supports are attached to the fan plate, and wherein the fan plate is attached to the fan wall.

12. The cooling unit of claim 10, further comprising:
a fan powered by the fan motor, wherein the fan is adapted to draw the heated air over the plurality of tube segments.

13. The cooling unit of claim 10, further comprising:
a variable frequency drive controller attached to the fan wall, wherein the variable frequency drive controller is adapted to control the fan motor.

14. The cooling unit of claim 10, further comprising:
a U-bend disposed on an opposite side of the tube support sheet from the plurality of tube segments, wherein the U-bend connects a first of the plurality of tube segments to a second of the plurality of tube segments.

15. The cooling unit of claim 10, further comprising:
a drain pan, wherein a second edge of the tube support sheet abuts the drain pan, and wherein the drain pan is oriented parallel to the top sheet.

16. The cooling unit of claim 10, further comprising:
a plurality of fin sheets oriented parallel to the tube support sheet, wherein the plurality of tube segments pass through the plurality of fin sheets.

17. A method comprising:
attaching a fan plate with a fan hole to a top sheet of an air handler, wherein the fan plate forms part of a fan wall that extends in a plane, wherein the top sheet is attached to a tube support sheet, wherein the tube support sheet has a plurality of holes, wherein a plurality of tubes are aligned with the plurality of holes, wherein each tube of the plurality of tubes is oriented orthogonally to the tube support sheet, and wherein the plurality of tubes are parallel to the fan plate;
attaching the tube support sheet to the fan wall; and
mounting a fan motor to the fan plate adjacent to the fan hole.

18. The method of claim 17, wherein an edge of the tube support sheet abuts an edge of the top sheet.

19. The method of claim 17, wherein each tube of the plurality of tubes is connected to another of the plurality of tubes by a U-bend pipe, and wherein the U-bend pipe is disposed on an opposite side of the tube support sheet from the tubes.

20. The method of claim 17, further comprising:
attaching a drain pan to the tube support sheet, wherein the drain pan is oriented perpendicular to both the tube support sheet and the fan plate.

* * * * *